(12) United States Patent
Nilson

(10) Patent No.: US 7,129,785 B1
(45) Date of Patent: Oct. 31, 2006

(54) METHODS AND SYSTEMS FOR BIASING A POWER AMPLIFIER

(75) Inventor: Chris Nilson, San Jose, CA (US)

(73) Assignee: Broadcom Corporation, Irvine, CA (US)

(*) Notice: Subject to any disclaimer, the term of this patent is extended or adjusted under 35 U.S.C. 154(b) by 75 days.

(21) Appl. No.: 10/826,464

(22) Filed: Apr. 16, 2004

Related U.S. Application Data

(60) Provisional application No. 60/463,968, filed on Apr. 18, 2003.

(51) Int. Cl.
*H03F 3/04* (2006.01)

(52) U.S. Cl. .................................. 330/296; 330/289

(58) Field of Classification Search ............... 330/285, 330/289, 296, 307
See application file for complete search history.

(56) References Cited

U.S. PATENT DOCUMENTS 6,194,968 B1 * 2/2001 Winslow .................. 330/289
6,529,080 B1 * 3/2003 Seymour et al. .......... 330/296

* cited by examiner

*Primary Examiner*—Henry Choe
(74) *Attorney, Agent, or Firm*—Sterne Kessler Goldstein & Fox, PLLC

(57) ABSTRACT

An amplifier circuit including a first transistor and a biasing circuit. The biasing circuit includes a process compensation circuit. The biasing circuit being coupled to a gate of the first transistor. A method for biasing an amplifier circuit is also included.

18 Claims, 7 Drawing Sheets

METHODS AND SYSTEMS FOR BIASING A POWER AMPLIFIER

CROSS REFERENCE TO RELATED APPLICATIONS

This application claims priority from U.S. Provisional Patent Application No. 60/463,968 filed on Apr. 18, 2003 and entitled "Methods and Systems for Biasing a Power Amplifier," which is incorporated herein by reference in its entirety.

BACKGROUND OF THE INVENTION

1. Field of the Invention

The present invention relates generally to power amplifier circuits, and more particularly, to methods and systems providing and controlling bias voltage to a power amplifier circuit to compensate for the effects of process and temperature induced variations.

2. Description of the Related Art

Portable transmitting devices are becoming more and more common, led first by the popularity of cellular telephones and increasingly by wireless networking products that embody standards such as Bluetooth and 802.11. High volume integrated circuits intended for consumer use promote robust competition and a continuous drive to lower manufacturing costs. Presently, these needs are best met for wireless products by fully integrated transceivers in CMOS technology. Furthermore, architectures favoring simplicity and small size are often more economical than elaborate architectures with higher performance. These principles are applied in the present invention Unfortunately, transmitters in fully integrated transceiver suffer output power drift due to manufacturing process variations of the amplification circuits (e.g., transistors, resistors, etc.). Transmitters in fully integrated transceivers can also drift due to temperature changes in varying environments and over time as the transmitter generates heat. These variations can cause manufacturing yield loss and/or variable link performance, all undesirable effects. In view of the foregoing, what is needed is a system and method for dynamically compensating for the effects of drift caused by thermal and process variations.

SUMMARY OF THE INVENTION

Broadly speaking, the present invention fills these needs by providing a method and system for providing and controlling bias voltage to a power amplifier circuit to compensate for the effects of process and temperature induced variations. It should be appreciated that the present invention can be implemented in numerous ways, including as a process, an apparatus, a system, computer readable media, or a device. Several inventive embodiments of the present invention are described below.

An amplifier circuit including a first transistor and a biasing circuit. The biasing circuit includes a process compensation circuit. The biasing circuit being coupled to a gate of the first transistor. The process compensation circuit can include a replica device circuit. The replica device circuit can include a replica transistor that replicates the characteristics of the first transistor. The replica device circuit can also include a constant current source coupled to the replica transistor. The replica transistor can be connected as a diode.

The process compensation circuit and the first transistor can be included in a single integrated circuit. The biasing circuit can also include a bias control circuit coupled to the gate of the first transistor. The bias control circuit can include a variable current source coupled to a control circuit. The control circuit can include a digital to analog converter.

The biasing circuit can also include a temperature compensation circuit coupled to the gate of the first transistor. The temperature compensation circuit can include a temperature proportional current source. The temperature compensation circuit and the first transistor are included in a single integrated circuit.

The amplifier circuit can be included within a transmitter. The amplifier circuit can be included within wireless data link transmitter.

Another embodiment provides a method of biasing an amplifier including supplying a process compensated DC bias voltage, producing the process compensated DC bias voltage in a process compensation circuit and applying the process compensated DC bias voltage to a gate of a first transistor. The process compensation circuit and the first transistor being on a single integrated circuit. The process compensated DC bias voltage is substantially equal to a threshold voltage of the first transistor.

The method can also include adjusting the process compensated DC bias voltage to select a desired class of operation for the first transistor. Adjusting the process compensated DC bias voltage can include receiving a control signal. The control signal can include a digital control signal. Receiving the control signal can include converting the digital control signal to an analog signal.

The method can also include adjusting the process compensated DC bias voltage to compensate for a temperature of the integrated circuit.

Another embodiment provides a data link system. The data link system includes a first transmitter including an amplifier that includes a first transistor and a biasing circuit. The biasing circuit including a process compensation circuit. The biasing circuit being coupled to a gate of the first transistor. The process compensation circuit and the first transistor are included in a single integrated circuit.

Still another embodiment provides a power amplifier circuit. The power amplifier circuit includes a first transistor and a biasing circuit. The biasing circuit including a process compensation circuit. The biasing circuit being coupled to a gate of the first transistor. The biasing circuit includes a process compensation circuit, a bias control circuit coupled to the gate of the first transistor and a temperature compensation circuit coupled to the gate of the first transistor. The process compensation circuit, the temperature compensation circuit and the first transistor are included in a single integrated circuit.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION OF THE EXEMPLARY EMBODIMENTS

Several exemplary embodiments for systems and methods of controlling the bias point of a power amplifier to compensate for variations in temperature and variations in manufacturing process will now be described. It will be apparent to those skilled in the art that the present invention may be practiced without some or all of the specific details set forth herein.

Efficient compensation of process caused variation and temperature caused variations can be achieved by using a scaled replica of the transmitter output transistor along with a number of other devices, to generate a bias voltage that can be applied to set the average operating point of the output device.

This invention is concerned with the details of the bias that comes between an input signal and the power amplifier (PA) in a transmitter. Controlling the bias to compensate for process variations and temperature compensates for the effects of process variations and temperature variations on the output power of the PA.

Figure 1:
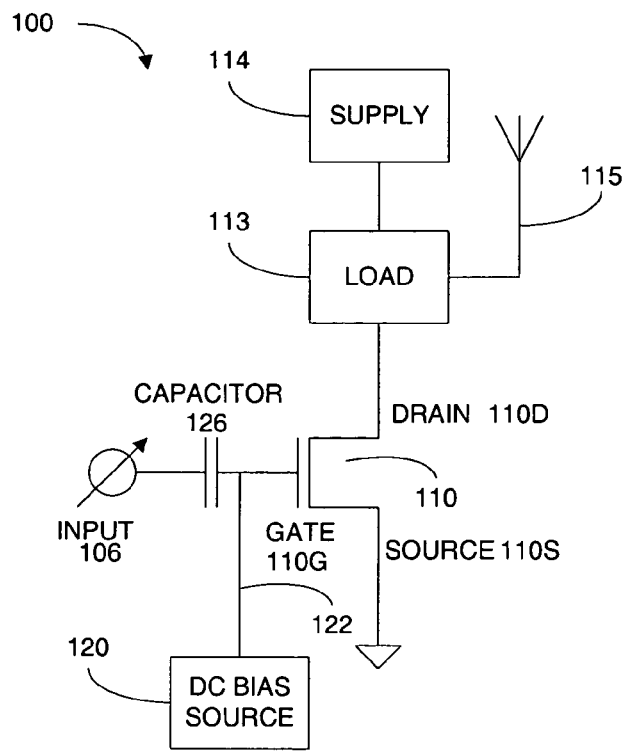
FIG. 1 shows a basic PA circuit, in accordance with one embodiment of the present invention.

FIG. 1 shows a basic PA circuit 100, in accordance with one embodiment of the present invention. A transistor 110 forms the basis of the amplifier circuit 100. The transistor 110 is a CMOS transistor and includes a gate 110G, a drain 110D and a source 10S. A load 113 and a current supply 114 are coupled to the drain 110D. The output antenna 115 is part of the load 113. An input signal 106 is applied to the gate 110G. A capacitor 126 isolates any DC component of the input signal 106 from being coupled to the gate 110G. A DC bias source 120 provides the DC bias 122 component for the gate 110G and thereby controls the amplification occurring in the transistor 110.

Figure 2A:
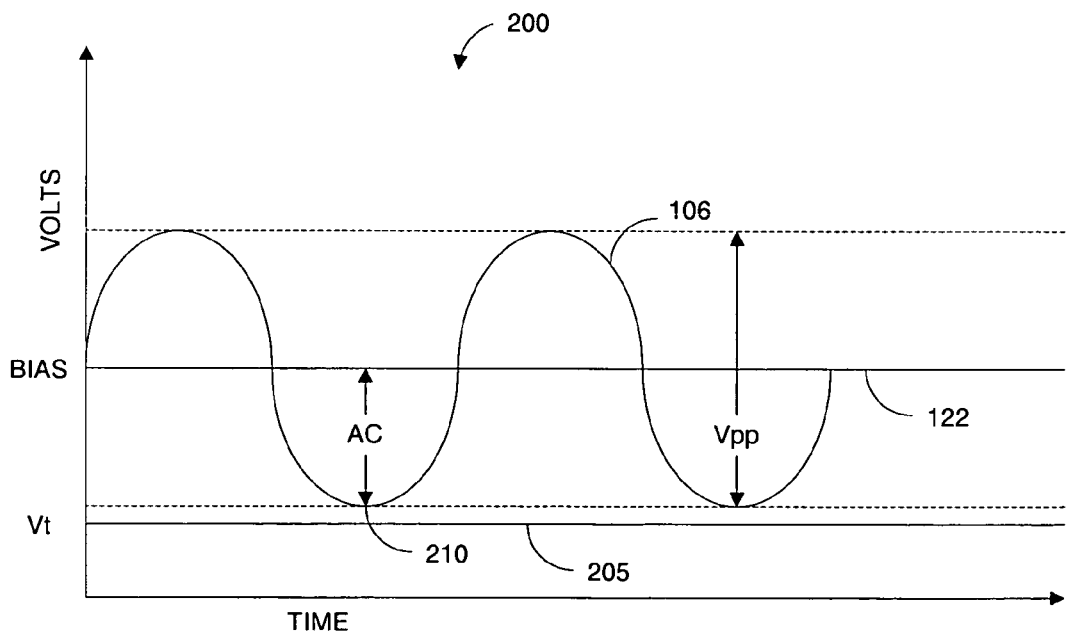
FIG. 2A is a graph of the relationship between input signal, the DC bias and the threshold voltage (Vt) of the transistor, in accordance with one embodiment of the present invention.

Amplifiers can operate in any one or more of several classes including class A, class AB, class B and class C. The class of operation is the determined in part by the relationship between the input signal 106, the DC bias 122 and the threshold voltage (Vt) of the transistor 110. FIG. 2A is a graph of the relationship between input signal 106, the DC bias 122 and the threshold voltage (Vt) of the transistor 110, in accordance with one embodiment of the present invention. As shown in FIG. 2A, the transistor 110 is biased for class A operation because at the lowest point 210 on the input signal 106 is still above the threshold voltage Vt and therefore the transistor remains forward biased and conducting throughout 100% of the input signal. By way of example, Vt could be 0.6v and if the input signal is 1.0v peak to peak (Vpp) the bias can be set at greater than 1.1v. As a result at the lowest voltage point 210 of the input signal 106, the transistor is still forward biased and therefore still conducting.

Figure 2B:
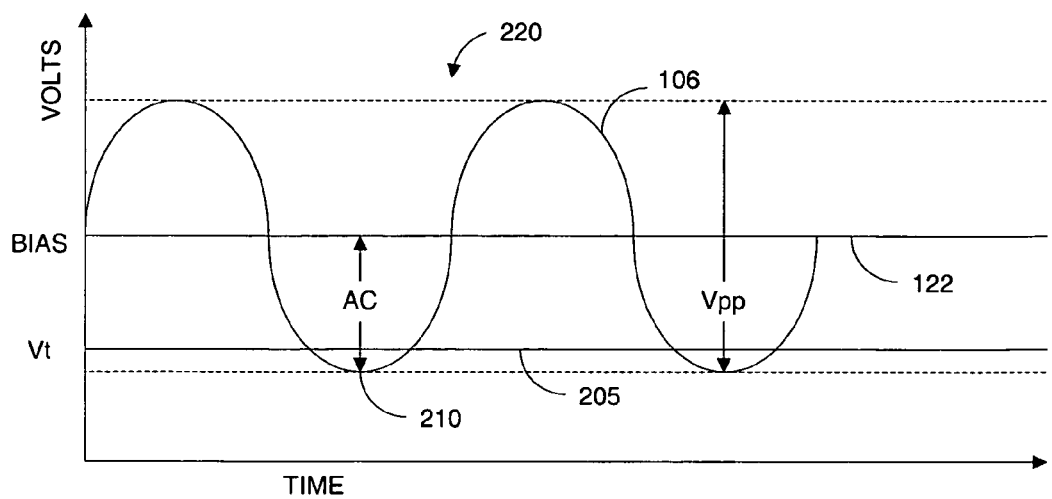
FIG. 2B is a graph of the relationship between input signal, the DC bias and the threshold voltage (Vt) of the transistor, in accordance with one embodiment of the present invention.

FIG. 2B is a graph 220 of the relationship between input signal 106, the DC bias 122 and the threshold voltage (Vt) of the transistor 110, in accordance with one embodiment of the present invention. As shown in FIG. 2B, the transistor 110 is biased for class AB operation because a negative portion of the input signal 106, including the low point 210 is lower than the threshold voltage Vt. Therefore the transistor 110 is not forward biased during the portion of the input signal that falls below Vt. This biasing relationship can be achieved by applying a bias voltage 122 that is higher than Vt but the difference between Vt and the bias voltage is less than one half the peak-to-peak amplitude of the input signal 106. As a result, the transistor is forward biased and conducting throughout something less than 100% (e.g., 51–99%) of the input signal. By way of example, Vt could be 0.6v and if the input signal is 1.0v peak to peak (Vpp) the bias can be set at about 1.0v. As a result at the lowest voltage point 210 of the input signal 106, the transistor is not forward biased and therefore does not conduct at the lowest input voltage point.

Figure 2C:
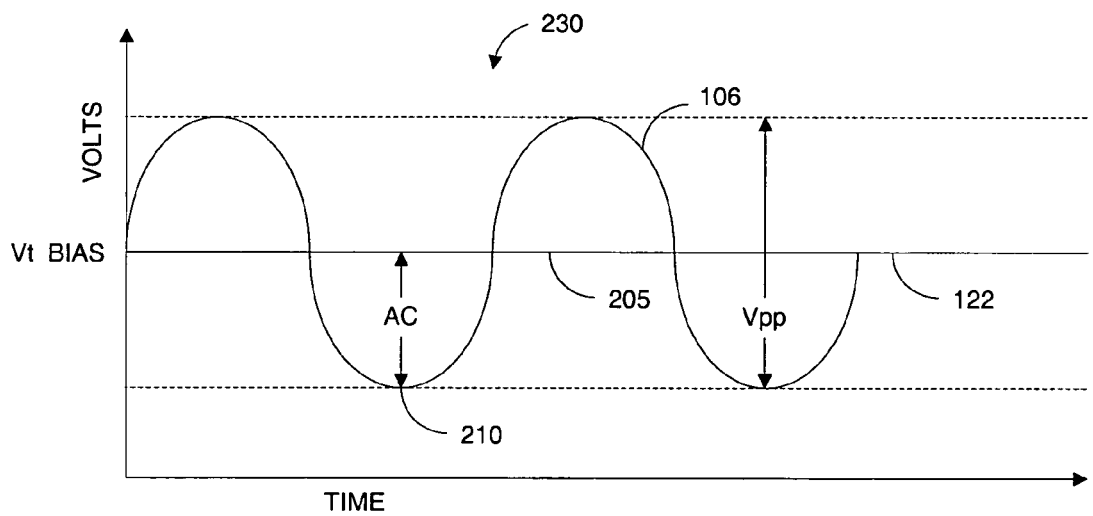
FIG. 2C is a graph of the relationship between input signal, the DC bias and the threshold voltage (Vt) of the transistor, in accordance with one embodiment of the present invention.

FIG. 2C is a graph 230 of the relationship between input signal 106, the DC bias 122 and the threshold voltage (Vt) of the transistor 110, in accordance with one embodiment of the present invention. As shown in FIG. 2C, the transistor 110 is biased for class B operation because the entire negative portion of the input signal 106, including the low point 210 is lower than the threshold voltage Vt. Therefore the transistor is not forward biased during the entire negative portion of the input signal 106. This biasing relationship can be achieved by applying a bias voltage 122 that is equal to Vt. As a result, the transistor is forward biased and conducting only during the positive portion (i.e., 50%) of the input signal. By way of example, Vt could be 0.6v and if the input signal is 1.0v peak to peak (Vpp) the bias can be set equal to Vt (i.e., at 0.6v). As a result, during the entire negative half of the input signal 106, the transistor is not forward biased and therefore not conducting.

Figure 2D:
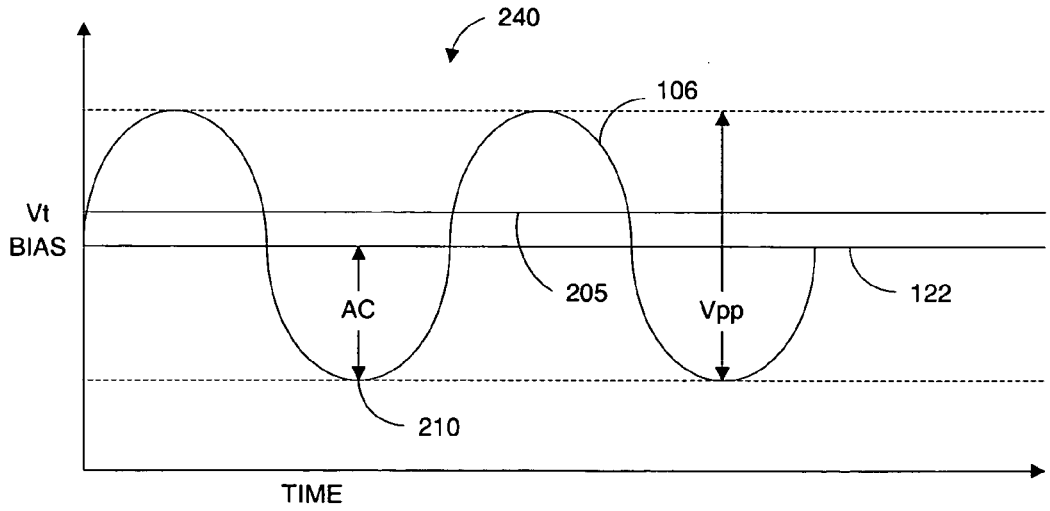
FIG. 2D is a graph of the relationship between input signal, the DC bias and the threshold voltage (Vt) of the transistor, in accordance with one embodiment of the present invention.

FIG. 2D is a graph 240 of the relationship between input signal 106, the DC bias 122 and the threshold voltage (Vt) of the transistor 110, in accordance with one embodiment of the present invention. As shown in FIG. 2D, the transistor 110 is biased for class C operation because the entire negative portion and a portion of the positive portion of the input signal 106 is lower than the threshold voltage Vt. Therefore the transistor 110 is not forward biased during the more than the entire negative portion of the input signal 106. This biasing relationship can be achieved by applying a bias voltage 122 that somewhat less than Vt. The transistor 110 is forward biased and conducting only during that portion of the positive portion of the input signal that is higher than Vt. As a result the transistor 110 is forward biased and conducting less than 50% (e.g., 1–49%) of the input signal 106. By way of example, Vt could be 0.6v and if the input signal is 1.0v peak to peak (Vpp) the bias can be set at less than Vt (i.e., less than 0.6v). As a result, only during that portion of the input signal 106 that exceeds Vt will forward bias the transistor.

In an ideal transmitter power amplifier (PA) circuit, the class of operation is selected according to the desired performance of the amplifier. Often the parameters (Vt 205, DC bias 122, input signal level 106) are selected so as to very precisely select a desired class of operation such as class AB as shown in FIG. 2B. The class of operation that is selected can be selected because of a balance between data throughput and power consumption. By way of example, in a class A operation (i.e., 100% forward biased PA), the power consumption of the PA is at the maximum and the performance (e.g., data throughput) may also be at the highest. In comparison, if the PA is biased for a class AB operation, then power consumption can be significantly reduced while performance is only slightly reduced. Class AB operation can therefore provide a significant reduction of energy consumption, which in a portable, battery powered application, may be a very important performance factor.

Referring again to FIG. 2B above, a slight upward shift in the DC bias 122 could shift the transistor 110 into class A operation. Similarly, a slight downward shift in Vt 205 could shift the transistor 110 into class A operation. While class A operation may be desirable in some circumstances, as stated above, class AB may be more desirable due to the more power efficient operations possible with a class AB amplifier over a class A amplifier, for the same output power.

In a typical amplifier circuit, the DC bias 122 can vary due to temperature variations in the DC bias source 120. Further, across an entire production lot of a given circuit, the various production variations can cause the Vt to vary from one amplifier circuit to another. Production variations can also occur in the mobility ($\mu$) of the current carriers within the transistors and other semiconductor components. By way of example, a reduction in $\mu$ can cause a given transistor to require a greater gate bias voltage to generate the same current that another similar transistor having a standard $\mu$ can generate with a smaller bias voltage.

Figure 2E:
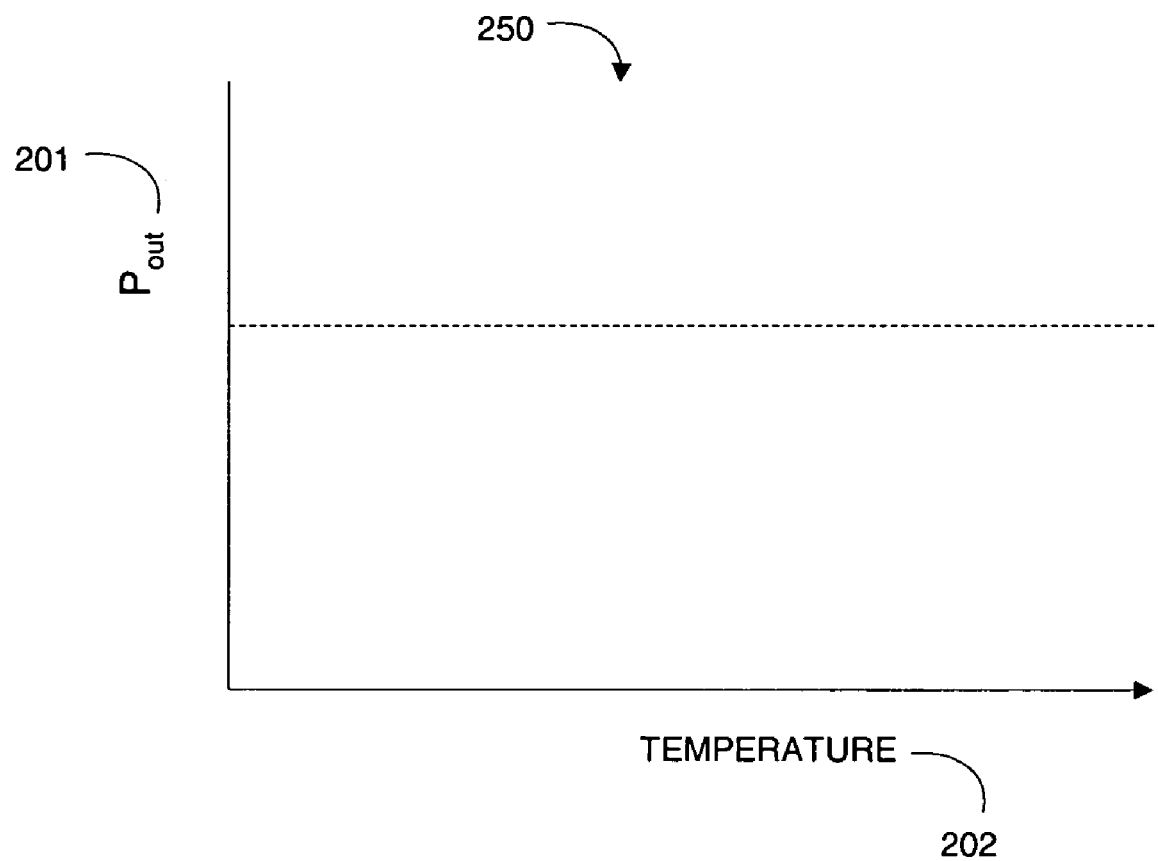
FIG. 2E is a graph of a PA output power level over a range of temperatures, in accordance with one embodiment of the present invention.

FIG. 2E is a graph 250 of a PA output power level over a range of temperatures, in accordance with one embodiment of the present invention. Ideally, the output power of the PA should be substantially constant across a large range of temperatures. Similarly, the PA output power level should remain substantially constant across the range of production variations so that each PA will perform substantially the same regardless of production lot. Unfortunately, the PA output power level can very significantly over the range of temperatures due to temperature-induced changes in bias voltage.

Figure 3:
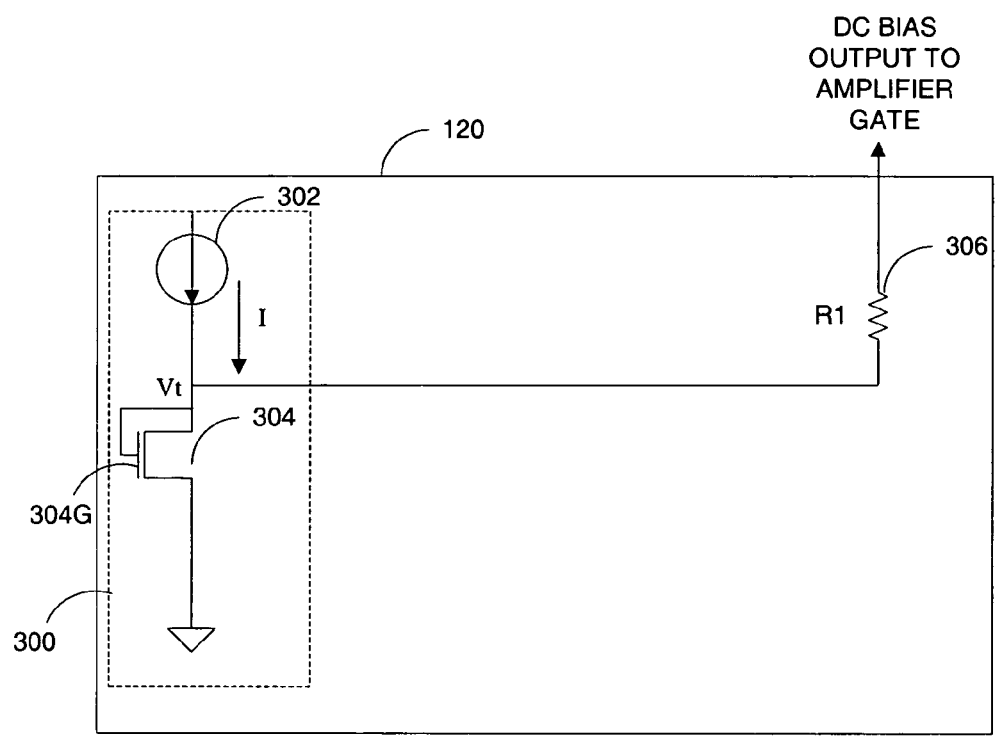
FIG. 3 shows a DC bias source, in accordance with one embodiment of the present invention.

Referring again to FIG. 1 above, the DC bias source 120 can compensate for the temperature and the various production variations that can cause variations in the PA output power. FIG. 3 shows a DC bias source 120, in accordance with one embodiment of the present invention. The DC bias source 120 includes a process variation compensating circuit 300 that includes a constant current source 302 connected in series with transistor 304. The transistor 304 is a replica of the transistor being biased by the DC bias source (e.g., transistor 110). The replica transistor can be a precise copy of the transistor being biased. Alternatively the replica transistor can be a scaled copy of the transistor being biased. The replica transistor has substantially the same operational characteristics (i.e., current carrier mobility, Vt, manufacturing process, device structure, etc.) as the transistor being biased.

The constant current source 302 outputs a current I1. All of current I1 is coupled to ground through transistor 304. No current flows through resistor 306 as there is no current flow across the gate 110G in a CMOS device and therefore no current path exists for current I1 to flow through resistor 306.

The gate 304G of transistor 304 is also coupled to the output of the constant current source 302. The gate 204G is coupled to the output of the constant current source 302 and therefore the gate has a gate voltage (Vgs) such that transistor 304 is automatically adjusted to flow the entire current I1. To achieve this, the gate 304G biases the transistor 304 so that the voltage drop across the transistor is substantially equal to a threshold voltage Vt. The Vt can vary as the process variations vary as described above, across the entire integrated circuit (i.e., semiconductor die) that also includes the transistor 110 of FIG. 1.

Vt is coupled to the resistor 306, having a resistance R1, and then to the gate 110G of the transistor 110. There is a slight difference voltage $\Delta V$ between Vgs and Vt. The relationship between these voltages can be expressed as follows:

$Vgs = \Delta V + Vt$ $\Delta V$ is inversely proportional to the square root of mobility ($\mu$) in the semiconductor transistor 304. Since the transistor 304 is manufactured in the same manufacturing process as the transistor 110, because both are on the same integrated circuit, then the mobility in transistor 304 is substantially the same as the mobility in transistor 110. As a result, the process variation compensating circuit 300 can substantially compensate for the process variations described above. The Vt applied to resistor 306 is therefore compensated for the process variations.

Figure 4:
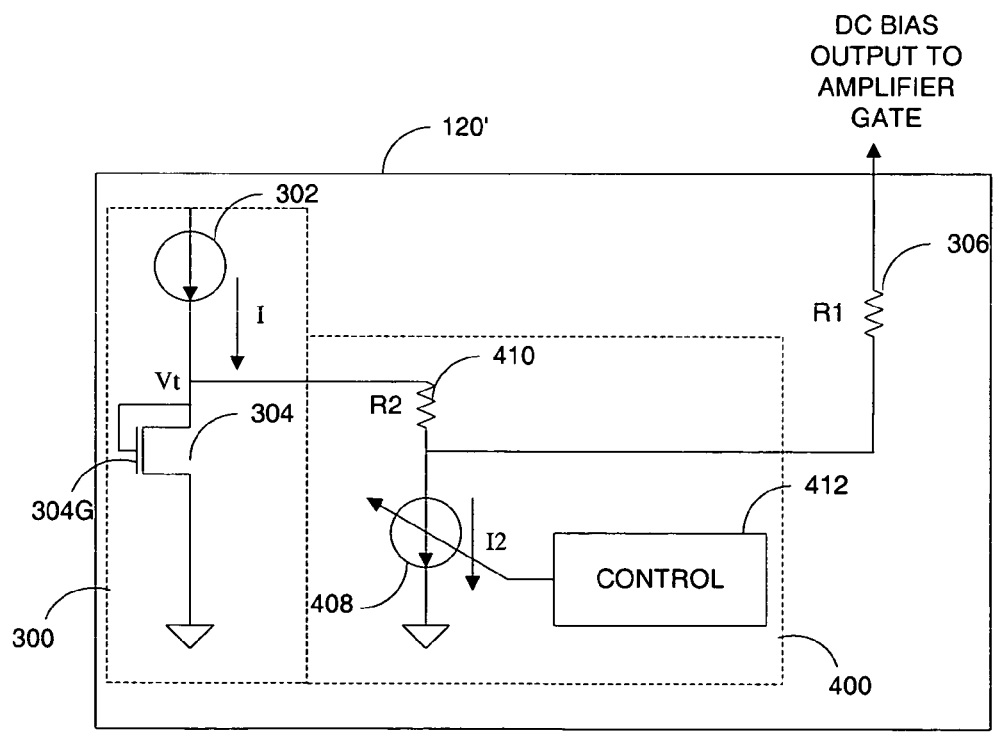
FIG. 4 shows a DC bias source, in accordance with one embodiment of the present invention.

FIG. 4 shows a DC bias source 120', in accordance with one embodiment of the present invention. The DC bias source 120' includes a bias control circuit 400. The bias control circuit 400 includes a variable current source 408, a resistor 410 and a control 412. The control 412 provides the ability to select and control the current I2 output of the variable current source 408. Varying the current I2 output from the variable current source 408 allows the Vt output from the process variation compensating circuit 300 to be manipulated so select a bias voltage to output and apply to transistor 110 so that transistor 110 is biased at a precisely selected class of the operation.

I2 is shown flowing through resistor 410 and the current source 408 to ground, thereby increasing the DC bias voltage output to the gate 110G of transistor 110 (i.e., DC bias voltage is greater than Vt). However, if I2 were greater than I1, then a portion of I2 could flow through resistor 410 and transistor 304 to ground, thereby decreasing the DC bias voltage.

The control 412 can be a digital control so that a digital control word received in the control 412 can adjust the I2. The control 412 can include a digital-to-analog (DAC) converter so as to receive a digital control word and produce an analog control signal to control the variable current source 408.

Figure 5:
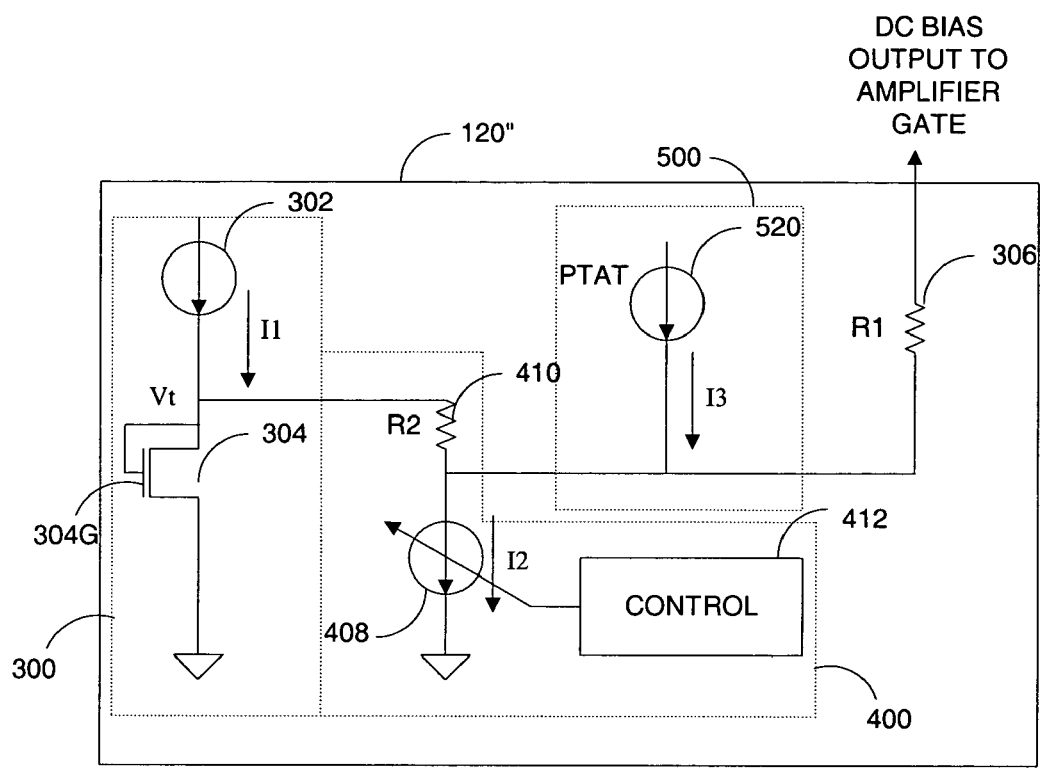
FIG. 5 shows a DC bias source, in accordance with one embodiment of the present invention.

FIG. 5 shows a DC bias source 120", in accordance with one embodiment of the present invention. The DC bias source 120" is similar to the DC bias source 120' of FIG. 4 above but also includes a temperature compensation circuit 500. The process temperature compensation circuit 500 can compensate for variations in temperature of the integrated circuit that includes both the bias source 120" and the transistor 110. The temperature compensation circuit 500 includes a current source 520 that outputs a third current I3. I3 is a proportional to absolute temperature (PTAT) current that is well known in the art as an available current source on an integrated circuit. I3 is related to I1 in the following relationship:

$$I3=I1(1+k)$$

Where k is a constant related to temperature of the integrated circuit. As a result the temperature compensation circuit 500 adjusts the DC bias voltage output from the DC bias source 120" above and below Vt as required to compensate for the temperature of the integrated circuit. In operation, as the temperature of the integrated circuit increases, the current I3 increases. A first portion of current I3 is dissipated to ground through the constant current device 408 to ground. A quantity of the first portion being controlled by the control 412 as described above. The remaining portion (i.e., the second portion) of current I3 flows through resistor 410 and transistor 304 to ground. As described above, as the current flow through resistor 410 increases, the increases voltage drop across resistor 410 increases and the DC bias voltage output from the DC bias source 120" decreases. In this manner, as the temperature of the integrated circuit increases the DC bias is automatically decreased a corresponding amount by the temperature compensation circuit 500 so as to maintain a temperature compensated, constant bias voltage to the transistor 110.

Figure 6:
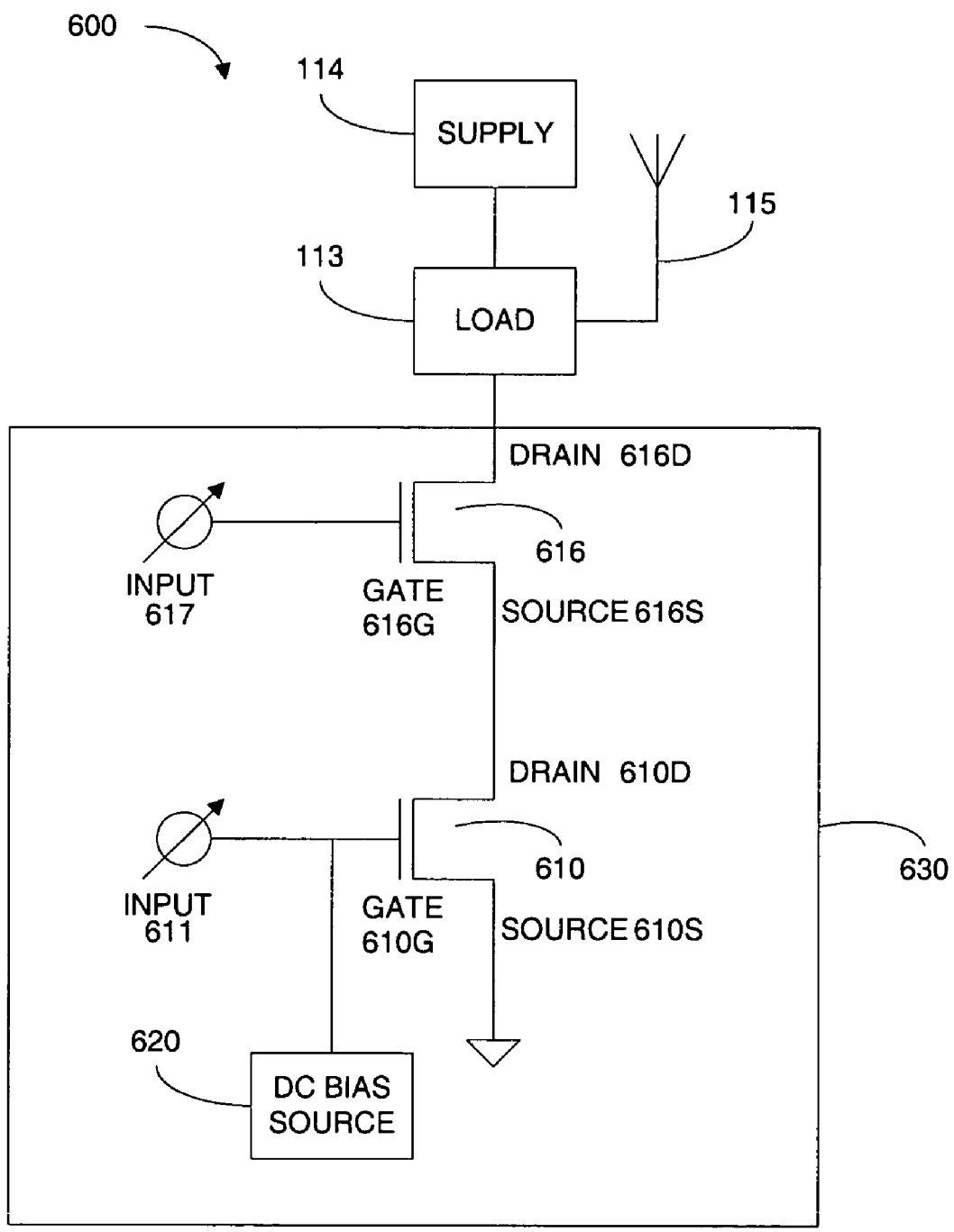
FIG. 6 is a schematic of an improved PA circuit, in accordance with one embodiment of the present invention.

FIG. 6 is a schematic of an improved PA circuit 600, in accordance with one embodiment of the present invention. The improved PA circuit 600 includes a first transistor 610 coupled in series with a second transistor 616. The second transistor 616 is coupled to a load 113 and a power supply 114. The load 113 can also include an antenna 115. The first transistor 610 includes a drain 610D, a source 610S and a gate 610G. A DC bias source 620 is coupled to the gate 610G. A first input signal 611 can also be coupled to the gate 610G. The DC bias source 620 can include one or more of the DC bias sources 120' and 120" described above so as to automatically compensate for process and/or temperature. The drain 610D is coupled to the source 616S of the second transistor 616. A second input signal 617 can also be coupled to the gate 616G of the second transistor 616.

The first input signal 611 can be the signal to be amplified by the PA circuit 600 and the second input signal 617 can be an output power control signal. The first transistor 610, the second transistor 616 and the DC bias source 620 can be combined on a single integrated circuit 630. The devices in the first transistor 610, the second transistor 616 and the DC bias source 620 can be formed by a CMOS process.

Figure 7:
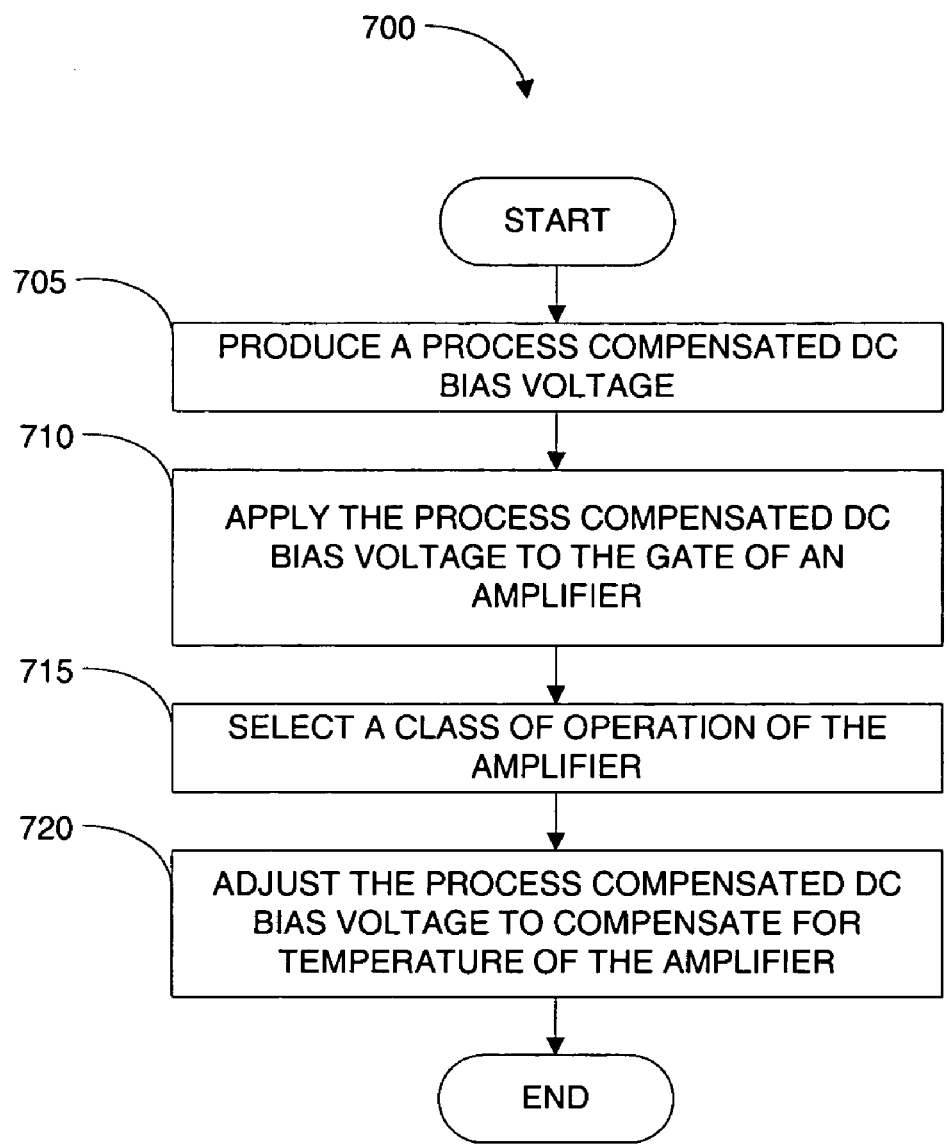
FIG. 7 is a flowchart diagram that illustrates the method operations performed in biasing an amplifier, in accordance with one embodiment of the present invention.

FIG. 7 is a flowchart diagram that illustrates the method operations 700 performed in biasing an amplifier, in accordance with one embodiment of the present invention. In an operation 705, a process compensated DC bias voltage is produced in a process compensation circuit. In an operation 710, the process compensated DC bias voltage is applied to a gate of a first transistor. The process compensation circuit and the first transistor being part of a single integrated circuit. The process compensated DC bias voltage is substantially equal to a threshold voltage of the first transistor.

In an operation 715, the process compensated DC bias voltage can be adjusted to select a desired class of operation for the first transistor. As described above, the class of operation can be class AB that is very close to class A operation. Since the process compensation circuit can automatically compensate for process variations, then the desired class of operation can be accurately and reliably selected across multiple integrated circuit manufacturing lots. Adjusting the DC bias voltage can include receiving a control signal. The control signal can be a digital control signal (e.g., a digital control word). The digital control word can be converted to an analog control signal through a digital-to-analog converter (DAC).

In an operation 720, the DC bias voltage can be adjusted to compensate for a temperature of the integrated circuit. Compensating the DC bias voltage for temperature ensures a temperature consistent performance of the transistor(s) being biased by the DC bias voltage.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data that can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An amplifier circuit comprising:
   a first transistor; and
   a biasing circuit including a process compensation circuit, the biasing circuit being coupled to a gate of the first transistor:
   wherein the process compensation circuit includes a replica device circuit having
       a replica transistor that replicates the characteristics of the first transistor, and
       a constant current source coupled to the replica transistor.

2. The circuit of claim 1, wherein the replica transistor is connected as a diode.

3. The circuit of claim 1, wherein the process compensation circuit and the first transistor are included in a single integrated circuit.

4. An amplifier circuit comprising:
a first transistor; and
a biasing circuit including a process compensation circuit, the biasing circuit being coupled to a gate of the first transistor;
wherein the biasing circuit further includes a bias control circuit coupled to the gate of the first transistor; and
wherein the bias control circuit includes a variable current source coupled to a control circuit.

5. The circuit of claim 4, wherein the control circuit includes a digital to analog converter.

6. An amplifier circuit comprising:
a first transistor; and
a biasing circuit including a process compensation circuit, the biasing circuit being coupled to a gate of the first transistor;
wherein the biasing circuit further includes a temperature compensation circuit coupled to the gate of the first transistor; and
wherein the temperature compensation circuit includes a temperature proportional current source.

7. The circuit of claim 6, wherein the temperature compensation circuit and the first transistor are included in a single integrated circuit.

8. The circuit of claim 1, wherein the amplifier circuit is included within a transmitter.

9. The circuit of claim 1, wherein the amplifier circuit is included within a wireless data link transmitter.

10. A method of supplying a process compensated DC bias voltage comprising:
generating a current using a constant current source;
producing the process compensated DC bias voltage in a process compensation circuit based on the current; and
applying the process compensated DC bias voltage to a gate of a first transistor, the process compensation circuit and the first transistor being on a single integrated circuit.

11. A method of supplying a process compensated DC bias voltage comprising:
producing the process compensated DC bias voltage in a process compensation circuit; and
applying the process compensated DC bias voltage to a gate of a first transistor, the process compensation circuit and the first transistor being on a single integrated circuit;
wherein the process compensated DC bias voltage is substantially equal to a threshold voltage of the first transistor.

12. The method of claim 10, further comprising adjusting the process compensated DC bias voltage to select a desired class of operation for the first transistor.

13. The method of claim 12, wherein adjusting the process compensated DC bias voltage includes receiving a control signal.

14. The method of claim 13, wherein the control signal includes a digital control signal.

15. The method of claim 14, wherein receiving the control signal includes converting the digital control signal to an analog signal.

16. The method of claim 10, further comprising adjusting the process compensated DC bias voltage to compensate for a temperature of the integrated circuit.

17. A data link system comprising:
a first transmitter including an amplifier that includes:
a first transistor; and
a biasing circuit including a process compensation circuits the biasing circuit being coupled to a gate of the first transistors wherein the process compensation circuit and the first transistor are included in a single integrated circuit;
wherein the process compensation circuit includes a replica device circuit having
a replica transistor that replicates the characteristics of the first transistor, and
a constant current source coupled to the replica transistor.

18. A power amplifier circuit comprising:
a first transistor; and
a biasing circuit coupled to a gate of the first transistor, the biasing circuit including:
a process compensation circuit;
a bias control circuit coupled to the gate of the first transistor; and
a temperature compensation circuit coupled to the gate of the first transistor, wherein the process compensation circuit, the temperature compensation circuit and the first transistor are included in a single integrated circuit; and
wherein the temperature compensation circuit includes a temperature proportional current source.

* * * * *

UNITED STATES PATENT AND TRADEMARK OFFICE
CERTIFICATE OF CORRECTION

| | | |
|---|---|---|
| PATENT NO. | : 7,129,785 B1 | Page 1 of 1 |
| APPLICATION NO. | : 10/826464 | |
| DATED | : October 31, 2006 | |
| INVENTOR(S) | : Christopher D. Nilson | |

It is certified that error appears in the above-identified patent and that said Letters Patent is hereby corrected as shown below:

In column 8, line 56, "transistor:" should be replaced with --transistor;--.

In column 10, lines 21-22, "circuits the biasing circuit being coupled to a gate of the first transistors wherein" should be replaced with --circuit, the biasing circuit being coupled to a gate of the first transistor, wherein--.

Signed and Sealed this

Twentieth Day of February, 2007

JON W. DUDAS
*Director of the United States Patent and Trademark Office*